(12) United States Patent
Billingsley et al.

(10) Patent No.: US 12,720,731 B2
(45) Date of Patent: Aug. 25, 2026

(54) MEMORY DEVICE ACCESS LINES

(71) Applicant: Micron Technology, Inc., Boise, ID (US)

(72) Inventors: Daniel Billingsley, Meridian, ID (US); Jaydip Guha, Boise, ID (US); Marko Milojevic, Boise, ID (US); Sau Ha Cheung, Boise, ID (US); Luca Fumagalli, Rio Rancho, NM (US)

(73) Assignee: Micron Technology, Inc., Boise, ID (US)

( * ) Notice: Subject to any disclaimer, the term of this patent is extended or adjusted under 35 U.S.C. 154(b) by 850 days.

(21) Appl. No.: 17/896,039

(22) Filed: Aug. 25, 2022

(65) Prior Publication Data

US 2024/0074153 A1 Feb. 29, 2024

(51) Int. Cl.
*H10B 12/00* (2023.01)
*H01B 1/02* (2006.01)

(52) U.S. Cl.
CPC ............... *H10B 12/34* (2023.02); *H01B 1/02* (2013.01); *H10B 12/053* (2023.02)

(58) Field of Classification Search
CPC ........................................... H10B 12/00–12/50
See application file for complete search history.

(56) References Cited

U.S. PATENT DOCUMENTS

| | | | | |
|---|---|---|---|---|
| 7,385,283 | B2 | 6/2008 | Wu et al. | |
| 2008/0233710 | A1 | 9/2008 | Hsu et al. | |
| 2012/0193752 | A1 | 8/2012 | Purushothaman et al. | |
| 2012/0241833 | A1* | 9/2012 | Nagashima | H10B 41/35 257/E21.546 |
| 2012/0273940 | A1 | 11/2012 | Jo | |
| 2013/0273691 | A1 | 10/2013 | Pascual et al. | |
| 2014/0248760 | A1* | 9/2014 | Goswami | H10D 84/0181 438/585 |
| 2014/0273347 | A1 | 9/2014 | Tseng et al. | |
| 2020/0303463 | A1* | 9/2020 | Redaelli | G11C 13/0004 |
| 2021/0183865 | A1* | 6/2021 | Neelapala | H10B 12/053 |
| 2021/0183866 | A1* | 6/2021 | Simsek-Ege | H10B 12/34 |
| 2021/0242206 | A1* | 8/2021 | Lin | H10D 84/0193 |

* cited by examiner

*Primary Examiner* — Kevin Parendo
(74) *Attorney, Agent, or Firm* — Brooks, Cameron & Huebsch, PLLC

(57) ABSTRACT

Methods, apparatuses, and systems related to conductive structures are described. An example conductive structure includes a first conductive material including a conductive metal nitride, where the first conductive material has a thickness of at least 0.5 nanometers, and a second conductive material including a conductive metal, where the second conductive material is disposed on a first surface of the first conductive material.

19 Claims, 5 Drawing Sheets

MEMORY DEVICE ACCESS LINES

TECHNICAL FIELD

The present disclosure relates generally to semiconductor structures, and more particularly to semiconductor structures including a conductive structure such as an access line.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

DETAILED DESCRIPTION

Figure 1A:
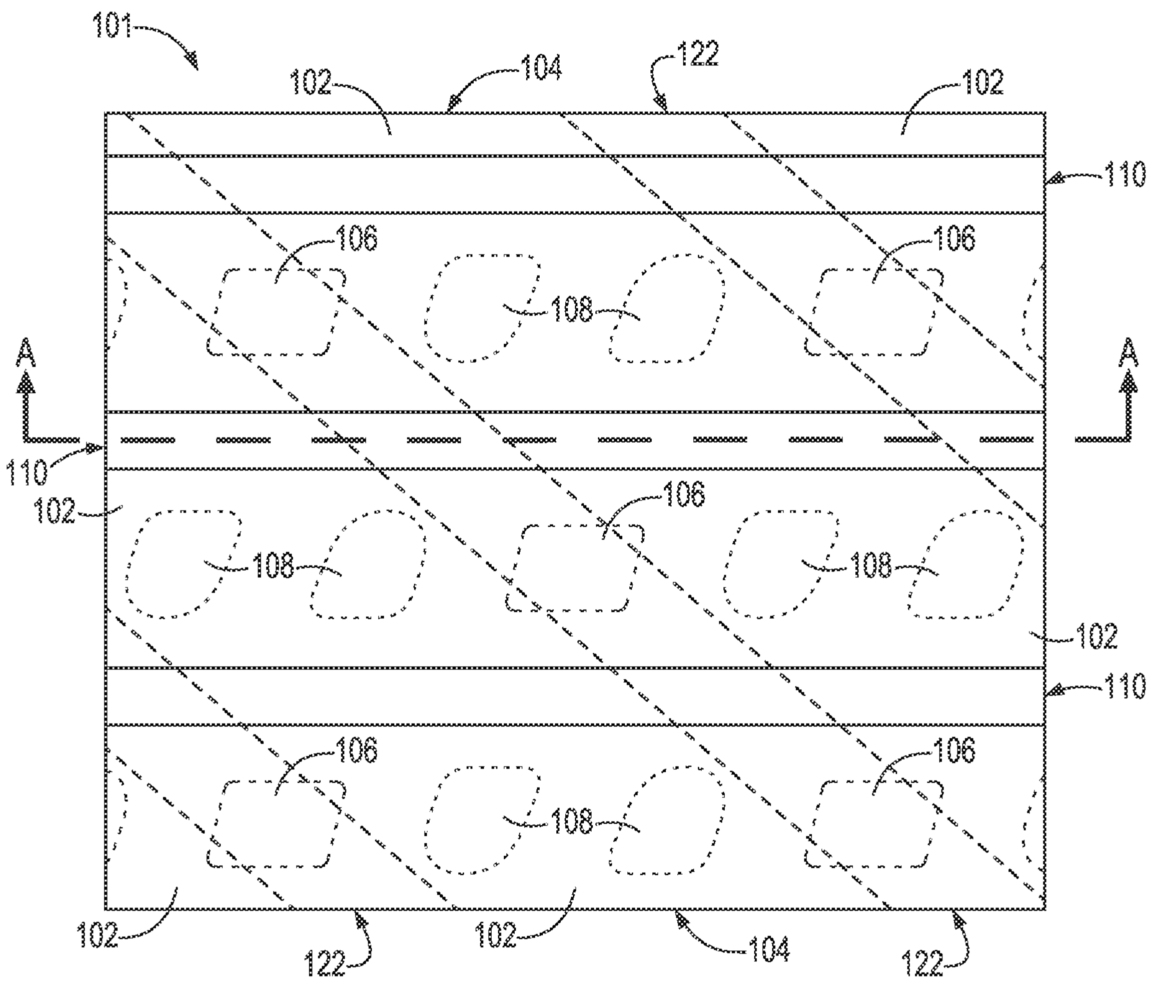
FIG. 1A illustrates a top-down view of a portion of an example semiconductor structure including a conductive structure in accordance with a few embodiments of the present disclosure.

As design rules scale to smaller dimensions, difficulties with fabrication and/or processing defects can arise. For instance, in one example process an opening may be formed through one or more layers of materials to receive subsequent processing steps to form one or more discrete components such as an access line and/or a sense line. However, etching to form such an opening at smaller dimensions may result in various processing defects such as necking (e.g., creating a distortion at an interface between two materials), void formation (e.g., an absence of an intended material), and/or another processing defect such as line bending and/or tapering of a component. Processing defects may contribute to unintended consequences related to the electrical properties of a semiconductor structure (e.g., memory device), which may adversely affect performance related to data access, storage, and/or processing functions of the semiconductor structure.

Some previous approaches employ an individual material, such as an individual metal, in a conductive structure. For example, some previous approaches form a access line via deposition of an individual material (e.g., molybdenum) in an opening (e.g., a trench). The individual material can be deposited in the opening from two different (e.g., opposing) directions. However, these approaches may be prone to processing defects such as line bending. As such, some other previous approaches form a access line via deposition of an individual material (e.g., molybdenum) in an opening from only one direction. Yet, such approaches, due at least to the use of the individual material, may also be prone to processing defects such as the void formation (e.g., void formation at an interface between the individual material and an adjacent material).

The present disclosure includes methods, apparatuses, and systems related to reduction of processing defects (e.g., tapering, voids, necking and/or bending) associated with a conductive structures such as access lines. An example of a conductive structure includes a first conductive material (e.g., a conductive metal nitride) and a second conductive material (e.g., a conductive metal), where the second conductive material is disposed on a first surface of the first conductive material. Thus, the first conductive material and the second conductive material can together form at least a portion of a total thickness of a conductive structure such as a access line, as described herein. Stated differently, the conductive structures herein can be damascene conductive structures, such as damascene access lines, formed of at least the first conductive material and the second conductive material. For instance, the second conductive material can be disposed on a top surface of the first conductive material and thereby together form at least a portion of a total thickness of a conductive structure.

The conductive structures herein exhibit a reduction and/or absence of processing defects (e.g., tapering, voids, necking and/or bending) and/or exhibit enhanced electrical performance as compared to other conductive structures. For example, having the second conductive material disposed on a surface (e.g., a top surface) of the first conductive material may mitigate an electrical potential difference between the second conductive material and a semiconductor substrate or other material underlying (e.g., in physical contact with) the first conductive material. Thus, the conductive structures herein can exhibit a lower threshold voltage (vt), as compared to a threshold volage exhibited by conductive structures formed with other materials/combinations of materials (e.g., tungsten, titanium nitride, molybdenum, etc.), as detailed herein.

As semiconductor structure fabrication design rules have scaled to smaller dimensions, a margin for patterning may be more difficult without unintended and/or undesired patterning and etching over another area. Thus, as described herein, embodiments can employ deposition (e.g., conformal deposition, selective deposition, etc.) of a second conductive material to a first conductive material to reliably yield conductive structures and resultant apparatuses having a desired dimension, and yet exhibit a reduction and/or absence of processing defects (e.g., tapering, voids, necking and/or bending). Moreover, in some embodiments the first conductive material may provide a "seed" or interface for deposition (e.g., selective deposition) of the second conductive material.

In the detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" something can refer to one or more such things. For example, a number of capacitors can refer to at least one capacitor.

The figures herein follow a numbering convention in which the first digit or digits correspond to the figure number of the drawing and the remaining digits identify an element or component in the drawing. Similar elements or components between different figures may be identified by the use of similar digits. For example, reference numeral 236 may reference element "36" in FIG. 2A, and a similar element may be referenced as 336 in FIG. 3A.

FIG. 1A illustrates a top-down view of a portion of an example semiconductor structure 101 including a conductive structure in accordance with a number of embodiments of the present disclosure. The semiconductor structure 101 illustrated in FIG. 1A is shown at a point in time that corresponds to various processing activities already having been performed.

Semiconductor structures formed on and/or in a substrate 104 can include access devices (e.g., transistors) and storage nodes (e.g., capacitors), in an example memory array. A dynamic random access memory (DRAM) array is one form of an example memory array that can be formed from semiconductor structures fabricated through a semiconductor structure fabrication process, as discussed herein. The memory array may have a number of access devices and storage nodes forming memory cells at the intersection of rows and columns. As illustrated in FIG. 1A, the memory cells can have an 8$F^2$ cell size, where "F" is a feature size corresponding to the cells. However, embodiments are not so limited. For instance, a 4$F^2$ or 6$F^2$ cell size may be utilized.

The memory array can include conductive structures. For instance, an access line (e.g., word line (WL)), may be used to activate an access device (e.g., a transistor), to access (e.g., turn "on" or "off" access to) the storage node of a memory cell. A sense line (e.g., bit line (BL) or digit line (DL)) may be used to read and/or program (e.g., write, refresh, erase, etc.) to and/or from a storage node of the memory cells.

Access lines 110, areas (e.g., active areas) for cell contacts 106, and areas (e.g., active areas) for capacitor cell contacts 108, and sense lines 122 may be formed on and/or in (e.g., in a trench) a semiconductor substrate such as substrate 104. The substrate 104 may be formed from various materials such as undoped or doped relatively inert materials on which various other materials may be deposited, masked, etched, for example, to form semiconductor structures thereon. Examples of a relatively inert substrate material may include monocrystalline silicon (monosilicon), polycrystalline silicon (polysilicon), and amorphous silicon, among others.

Access lines 110 and/or sense lines 122 can be formed by patterning and etching the substrate 104 to form trenches in the substrate 104. Subsequently materials can be deposited in the trenches to form the access lines 110 and/or sense lines 122. That is, embodiments provide that a number of materials that have previously been formed beneath a mask material may also be etched to form the opening in the substrate. Various etching processes may be utilized. Etching is a process to remove (e.g., chemically) different materials selectively and/or non-selectively from among different portions of semiconductor structures during the fabrication process. Two types of etchants are liquid-phase (wet) and plasma-phase (dry). Wet etching uses etchants in liquid form. During a wet etch, a semiconductor structure can be immersed in a bath of the etchant, which can be agitated to achieve good process control.

As an example, buffered hydrofluoric acid (BHF) can be used to etch silicon dioxide. As an alternative to immersion, certain semiconductor structure fabrication tools and equipment (e.g., a semiconductor structure processing chamber) may employ a gas to cushion and protect one side of the wafer while an etchant is applied to the other side. Plasma etching tools and equipment can operate in several modes by adjusting parameters of a plasma gas applied to a semiconductor structure undergoing a fabrication process. The plasma can produce energetic free radicals, neutrally charged, that react at a surface of the semiconductor structure. A source gas for the plasma can contain small molecules rich in chlorine or fluorine, for instance.

The pattern may be etched to remove a portion of the mask material, and a number of materials that have previously been formed beneath the mask material and form an opening to areas for conductive structures, cell contacts, and/or other components. After etching the portion of the mask material to form the areas for the conductive structures, cell contacts, and/or other structures, another portion of the mask material may remain over a portion of the areas for the conductive structures, cell contacts, and/or other structures. A second etch may be used to remove this remaining portion of the mask material. For some embodiments, a portion of the mask material may remain to protect the capacitor cells or other contacts during this process (e.g., may not be patterned and etched), for instance.

Figure 1B:
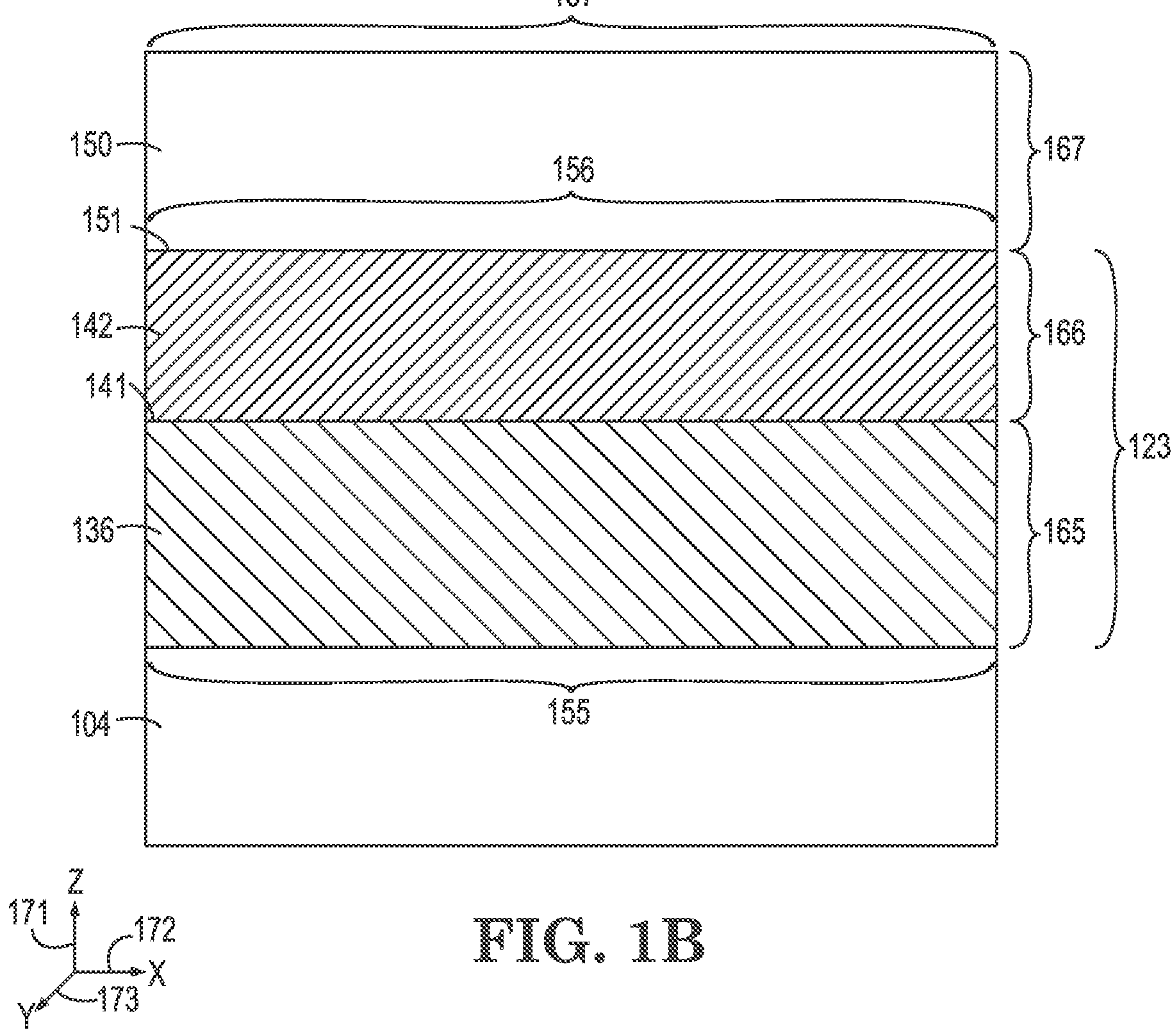
FIG. 1B illustrates a view of a portion of an example semiconductor structure including a conductive structure in accordance with a number of embodiments of the present disclosure.

FIG. 1A illustrates that the openings formed by etching a portion of a mask material 102 (and a number of materials that have previously been formed beneath the mask material) have been filled in using a conductive fill (e.g., conductive fill 123 as illustrated in further detail in FIG. 1B). For instance, the conductive fill can include a combination of a first conductive material and a second conductive material for formation of at least the access lines 110, as discussed further herein. The first conductive material can be deposited in the opening formed by etching a portion of the mask material 102 (and a number of materials that have previously been formed beneath the mask material) and the second conductive material can be deposited in the opening on the first conductive material. In some embodiments, the first conductive material can be deposited as a conformal material or can be selectively deposited, as discussed herein. The second conductive material can be selectively deposited, as discussed herein.

FIG. 1B illustrates a view of a portion of an example semiconductor structure including a conductive structure in accordance with a number of embodiments of the present disclosure. FIG. 1B illustrates a view along cutline AA shown in FIG. 1A of an access line, with the addition of a mask material 150 thereto. In other words, after the first conductive material and the second conductive material are formed, the mask material 150 can be formed (e.g., deposited) thereon.

The mask material 150 may be a monocrystalline silicon (monosilicon), polycrystalline silicon (polysilicon), and amorphous silicon, among other possibilities. For instance, the mask material 150 can be a polysilicon material. However, in some embodiments, the mask material 150 may be a nitride material, for example. An example of a nitride material includes, but is not limited to, silicon nitride ($SiN_X$, $Si_3N_4$).

As illustrated in FIG. 1B, the conductive fill 123 can include a first conductive material 136 and a second conductive material 142. In some embodiments, the conductive fill material can include only a first conductive material 136 and a second conductive material 142.

The mask material 150 can be formed subsequently to the first conductive material 136 and the second conductive material 142. The mask material 150 can be separated from the first conductive material 136 by the second conductive material 142 (e.g., the second conductive material 142 can be formed between the first conductive material 136 and the mask material 150). In some embodiments, a barrier material (not illustrated) can be deposited on a top surface of the second conductive material. The barrier material can be a dielectric material. The first conductive material 136, the second conductive material 142, the mask material 150, and in some embodiments the barrier material, can be formed with one or more semiconductor structure fabrication processes, such as chemical vapor deposition, for instance.

The first conductive material 136 can be a conductive metal nitride. Examples of conductive metal nitrides include titanium nitride (TiN), tantalum nitride (TaN), or a combination thereof, among other possibilities. For instance, in some embodiments the first conductive material can include TiN. In some embodiments, the first conductive material 136 can be formed of only TiN, in the absence of other materials.

The second conductive material 142 can be a conductive metal. Examples of conductive metals include tungsten (W), titanium (Ti), tantalum (Ta), ruthenium (Ru), cobalt (Co), molybdenum (Mo), or any combinations thereof, among other possibilities. For instance, in some embodiments the second conductive material 142 can include Mo. In some embodiments, the second conductive material 142 can be formed of only Mo, in the absence of other materials.

Figures 2A, 2B, 2C, 2D, 2E:
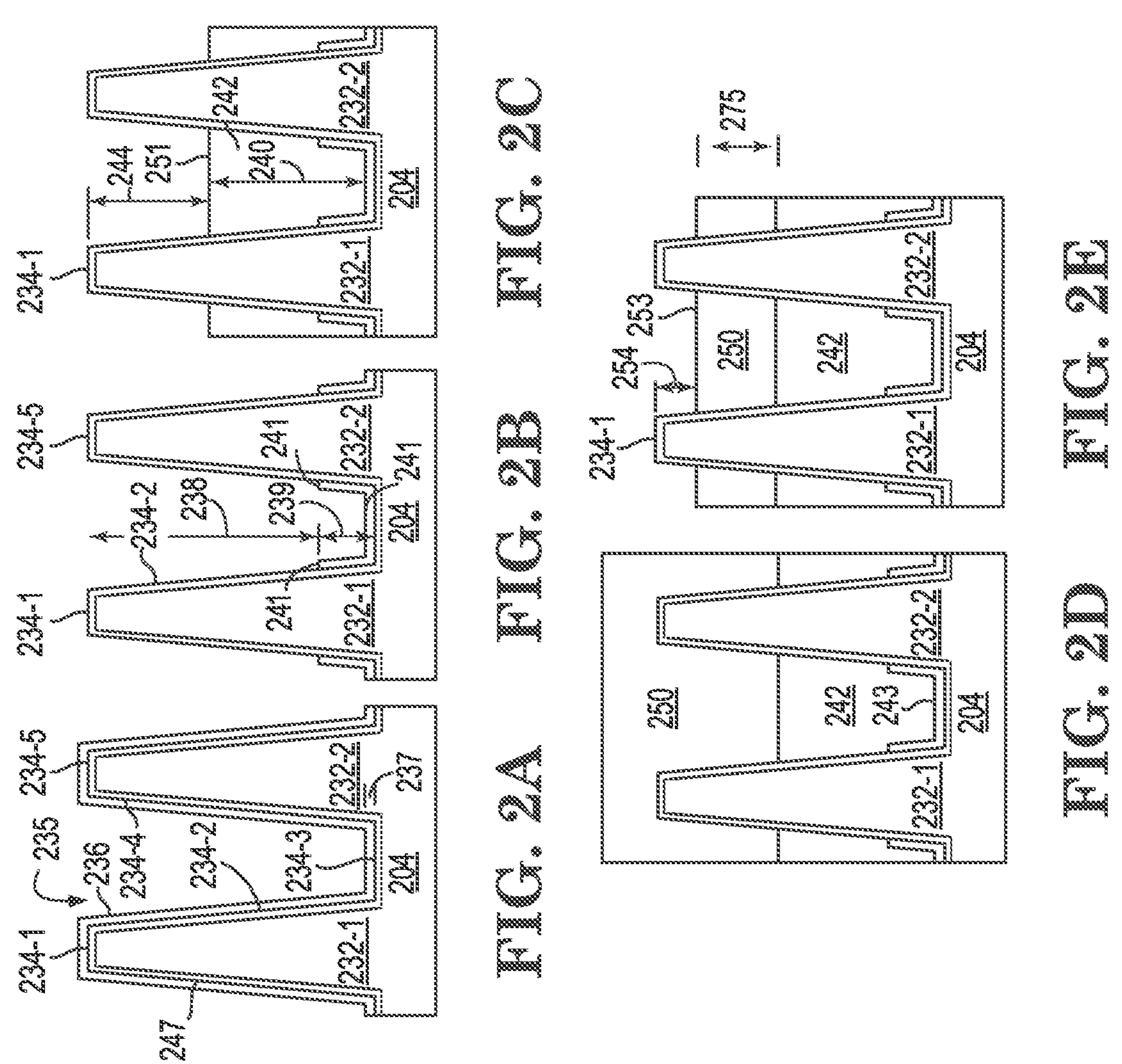
FIG. 2A-2E illustrate views of a portion of an example semiconductor structure including a conductive structure at a particular stages in an example semiconductor structure fabrication sequence in accordance with a number of embodiments of the present disclosure.

The first conductive material can have a thickness 165 of at least 0.5 nanometers, at least 1.0 nanometers, at least 1.5 nanometers, at least 2 nanometers, at least 5 nanometers, or at least 10 nanometers. For instance, the first conductive material 136 can have a thickness 165 in a range from 0.5 nanometers to 90 nanometers, in a range from 0.5 nanometers to 50 nanometers, or in a range from 0.5 to 2.5 nanometers. All individual values and subranges from 0.5 to 90 nanometers are included; for example, first conductive material can have a thickness from a lower limit of 0.5, 1.0, 1.5, 2.0, 2.5, 5, or 10 nanometers to an upper limit of 90, 80, 70, 50, 40, 30, 20, 10, 5, or 2.5 nanometers. The thickness 165 extends in a vertical ("Z") direction 171 (e.g., perpendicular to a first horizontal ("X") direction 172 and a second horizontal ("Y") direction 173 plane). The vertical ("Z") direction 171 may extend (e.g., vertically) from a surface (e.g., surface 234-3 as illustrated in FIG. 2A) of the substrate discussed herein.

The second conductive material 142 can be formed to have a thickness 166 in a range from 10 nanometers to 100 nanometers. All individual values and subranges from 10 nanometers to 100 nanometers are included; for example, the second conductive material 142 can have a thickness from a lower limit of 10, 20, or 30 nanometers to an upper limit of 100, 90, 80, 60, 70, 50, 40, 30, or 20 nanometers. The thickness 166 extends in the vertical ("Z") direction 171.

A sum of the thickness 165 and the thickness 166 can be in a range from 60 to 100 nanometers. Stated differently, the conductive fill 123 can have a thickness in a range from 60 to 100 nanometers. All individual values and subranges from 60 nanometers to 100 nanometers are included; for example, the sum of the thickness 165 and the thickness 166 be in a range from a lower limit of 60, 70, 80 or 85 nanometers to an upper limit of 100, 95, or 90 nanometers. For instance, in some embodiments the sum of the thickness 165 and the thickness 166 can be equal to at least 80 nanometers, among other possibilities.

While thickness 165 and thickness 166 are illustrated in FIG. 1B as having similar thickness, the thickness 165 and thickness 166 can be different (e.g., as discussed herein with respect to FIGS. 2A-2E). In some embodiments, the thickness 165 can be greater than the thickness 166. For instance, the thickness 165 can be at least two times or at least three times greater than the thickness 166. However, in some embodiments the thickness 166 can be greater than the thickness 165. For instance, the thickness 166 can be at least two times or at least three times greater than the thickness 165.

In some embodiments, a width 155 of the first conductive material 136 can be less than or equal to a width 156 of the second conductive material 142. For instance, the width 155 of the first conductive material 136 can be equal to the width 156 of the second conductive material 142 at an interface between the first conductive material 136 and the second conductive material 142. However, in some embodiments, the width 155 of the first conductive material 136 can be less than the width 156 of the second conductive material 142 at an interface between the first conductive material 136 and the second conductive material 142. The width 155 and the width 156 each extend in the horizontal ("X") direction 173.

Figures 3A, 3B, 3C, 3D, 3E, 3F:
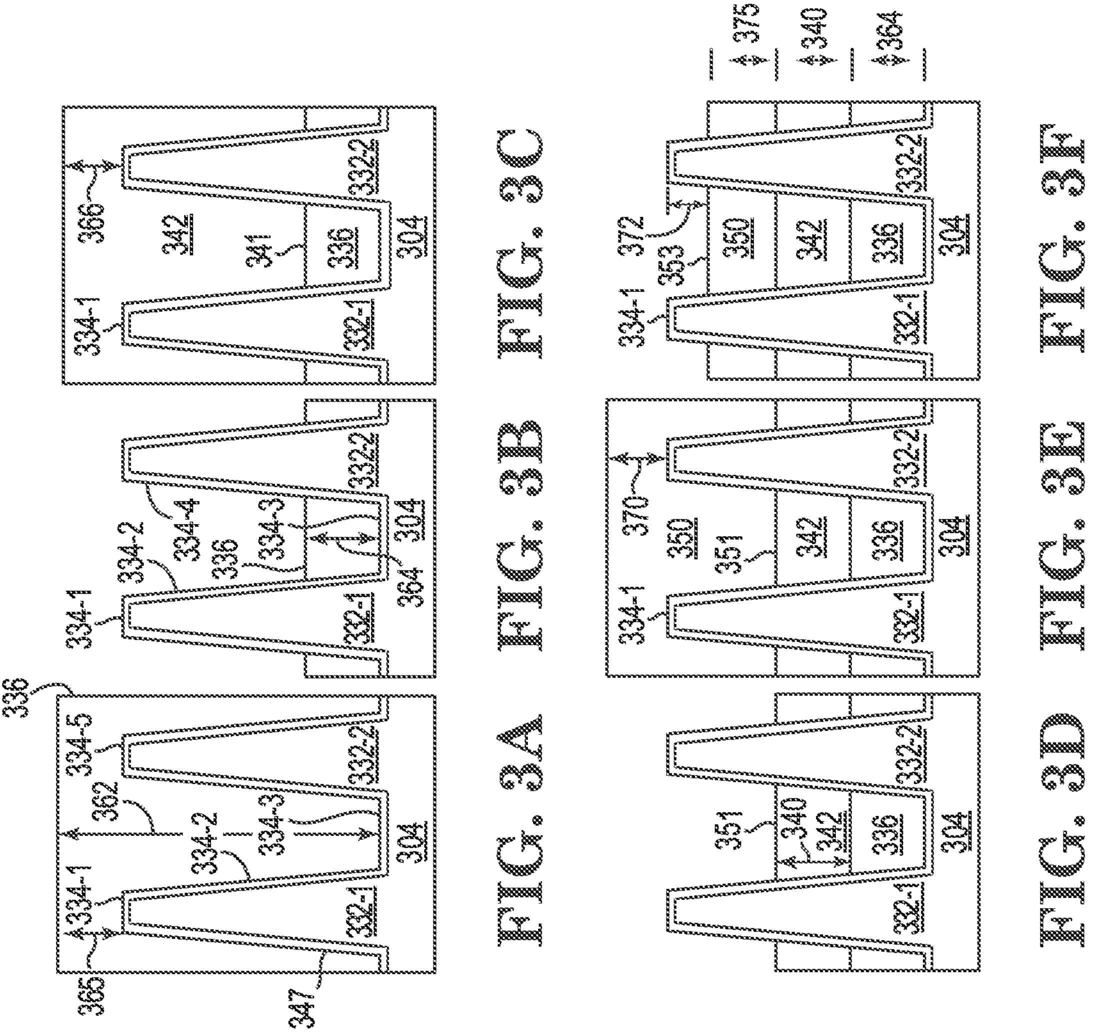
FIG. 3A-3F illustrate views of a portion of an example semiconductor structure including a conductive structure at a particular stages in an example semiconductor structure fabrication sequence in accordance with a number of embodiments of the present disclosure.

In some embodiments the first conductive material 136 and/or the second conductive material 142 can have a non-uniform thickness and/or non-uniform width. For instance, as illustrated in FIG. 2E and FIG. 3F the first conductive material and the second conductive material can be tapered (e.g., having a relatively narrow bottom surface compared to a top surface). Having a non-uniform thickness and/or non-uniform width can ease fabrication of the conductive structures and promote uniform electrical/mechanical characteristics of the conductive structures.

One or more embodiments provide that the first conductive material 136 and/or the second conductive material 142 can form at least a portion of a conductive structure, such as access line. For instance, the combined thickness of the first conductive material 136 and the thickness of the second conductive material 142 can form at least a portion of a total thickness of a access line. For instance, a sum of the thickness 165 and the thickness 166 can equal a total thickness of a access line (e.g., at a particular location of the access line). Stated differently, in some embodiments a thickness of a access line can be equal to the sum of the thickness 165 and the thickness 166 in the absence of any other material (e.g., any other conductive material).

In some embodiments, the second conductive material 142 can be disposed on a surface of the first conductive material 136. For instance, the second conductive material 142 can be disposed on a top surface 141 (referred to as 241, 341 in other figures) of the first conductive material 136. For example, the second conductive material 142 can be disposed only on a top surface 141 of the first conductive material (e.g., as illustrated in FIGS. 3D, 3E, and 3F), and not on any other surfaces of the first conductive material 136. Having the second conductive material 142 disposed only on a top surface 141 of the first conductive material 136 can ease formation of the conductive structures herein and/or can yield conductive structures that exhibit reduced processing defects and/or a given electrical performance characteristic (e.g., exhibit lower electrical resistance than other conductive structures configurations).

However, in some embodiments the second conductive material 142 can be disposed on a plurality of surfaces of the first conductive material 136. For instance, the second conductive material 142 can be disposed on a top surface of the first conductive material 136 and at least one other surface (having a different orientation than the top surface). For example, the second conductive material 142 can be disposed on a top surface 141 of the first conductive material 136 and can be disposed at least on side surfaces (e.g., opposing side surfaces) of the first conductive material 136, as discussed herein with respect to FIGS. 2C, 2D, and 2E.

As mentioned, the mask material 150 can be disposed (formed) on a surface of the second conductive material 142. For instance, the mask material 150 can be a polysilicon material disposed on a top surface 151 of the second conductive material 142. In some examples, the mask material 150 can be formed only on the top surface 151 of the second conductive material 142, and not on other surfaces of the second conductive material 142.

The mask material 150 can be formed to have a thickness 167 from 20 nanometers to 45 nanometers. All individual values and subranges from 20 to 45 nanometers are included; for example, mask material 150 can have a thickness from a lower limit of 20, 22, or 25 nanometers to an upper limit of 45, 40, or 35 nanometers. The thickness 167 extends in the vertical ("Z") direction 171.

The mask material 150 can have a width 157 that is at least equal to (or greater than) the width 156 of the second conductive material 142. For instance, the width 157 of the mask material 150 can be equal to or greater than the width 156 of the second conductive material 142 at an interface (e.g., at the top surface 151) between the mask material 150 and the second conductive material 142. The width 157 extends in the horizontal ("X") direction 173.

FIG. 2A-2E illustrate views of a portion of an example semiconductor structure including a conductive structure at a particular stages in an example semiconductor structure fabrication sequence in accordance with a number of embodiments of the present disclosure. For instance, FIG. 2A illustrates a view of a portion of an example semiconductor structure including a conductive structure (e.g., access line 110) at a particular stage in an example semiconductor structure fabrication sequence in accordance with a number of embodiments of the present disclosure. FIG. 2A, illustrates cutline AA shown in FIG. 1A, with a portion of the access line 110 formed.

Source/drain regions such as a first source/drain region 232-1 (also shown as 332-1 in other figures), and a second source/drain region 232-2 (also shown as 332-2 in other figures) are present in FIG. 2A. In some embodiments, the source/drain regions can be alternating source/drain regions. For instance, the first source/drain region 232-1 can be a drain region or a source region and the second source/drain region 232-2 can be the other of the drain region or the source region, among other possibilities. The source/drain regions can be formed in and/or on the substrate 204. For instance, the source/drain regions can be formed of doped regions in the substrate 204 and/or can be formed of various layers of materials such as doped or undoped materials formed on the substrate 204. The source/drain regions can be formed of various suitable materials such as a polysilicon material including a p-type dopant or an n-type dopant. By way of example, and not by way of limitation, the n-type dopant may include phosphorous (P) and the p-type dopant may include boron (B).

As shown in FIG. 2A, a trench 235 can be formed in the substrate 204. The trench 235 can be formed by one or more semiconductor structure fabrication processes (e.g., etches, such as selective etches). For instance, the trench 235 can be formed with a dry etch or a wet etch. While an individual trench 235 is shown in FIG. 2A, embodiments are not so limited.

One or more embodiments provide that the trench 235 may extend to and/or adjacent to a source/drain region such as the first source/drain region 232-1 and/or the second source/drain region 232-2. One or more embodiments provide that the trench 235 is formed so that materials and/or etched materials (e.g., first conductive material 236, a second conductive material 242, and the mask material 250) have a width from 5 to 9 nanometers in a horizontal direction (e.g., the horizontal ("X") direction 272) that is perpendicular to the vertical ("Z") direction 271.

The trench 235 can provide a conductive structure deposition space. Thus, as detailed herein, at least the second conductive material 242 and the first conductive material 236 can be disposed in the trench 235.

For example, the first conductive material 236 can be deposited in at least a portion of the trench 235. The first conductive material 236 can be conformally deposited, selectively deposited, or otherwise deposited in the trench 235.

As illustrated in FIG. 2A, the first conductive material 236 can be conformally deposited. The conformally deposited first conductive material 236 can have a uniform thickness 237. That is, the first conductive material 236 can have a uniform thickness 237 across an entire width of the first conductive material 236. For instance, the first conductive material 236 can be conformally deposited at a uniform thickness on each of the source/drain regions (e.g., the first source/drain region 232-1 and the second source/drain region 232-2) and the substrate 204. For example, the first conductive material 236 can be conformally deposited on at least a first (e.g., top) surface 234-1 and a second (e.g., side) surface 234-2 of the first source/drain region 232-1, a surface (e.g., top) surface 234-3 of the substrate 204, along with a first (e.g., side) surface 234-4 and a second (e.g., top) surface 234-5 of the second source/drain region 232-2, among other possibilities. The thickness 237 of the first conductive material can be equal to the thicknesses of the first conductive material described herein. For instance, the thickness 237 can be equal to the thickness 165 described in FIG. 1B.

In some embodiments, the first conductive material 236 can be conformally deposited at or near a continuity limit of the first conductive material 236. For instance, the first conductive material 236 can be TiN that is deposited at or near the continuity limit of TiN (e.g., 0.5 nanometers), among other possibilities. However, other thicknesses of the first conductive material 236 such as those described herein are possible.

As illustrated in FIG. 2A, the first conductive material 236 can be deposited on a gate oxide 247. The gate oxide can be a continuous layer of material on a surface of the substrate and/or the source drain regions, for instance as illustrated in FIG. 2A. The gate oxide 247 can be formed of a dielectric material. As used herein, the term "dielectric material" refers to and includes electrically insulative materials. Dielectric materials, as discussed herein, may include, but is not limited to, one or more of an insulative oxide material or an insulative nitride material. A dielectric oxide may be an oxide material, a metal oxide material, or a combination thereof. The dielectric oxide may include, but is not limited to, a silicon oxide ($SiO_x$), doped $SiO_x$, phosphosilicate glass, borosilicate glass, borophosphosilicate glass, fluorosilicate glass, tetraethylorthosilicate (TEOS), aluminum oxide ($AlO_x$), gadolinium oxide (GdOx), hafnium oxide (HfOx), magnesium oxide (MgOx), niobium oxide (NbOx), tantalum oxide (TaOx), titanium oxide (TiOx), zirconium oxide carboxynitride material (e.g., SiOxCzNy), a combination thereof or a combination of one or more of the listed materials with silicon oxide.

In some embodiments, the deposited first conductive material 236 can undergo an etching process such as a wet etch and/or a dry etch to remove a portion of the deposited first conductive material. For instance, as illustrated in FIG. 2B, a portion 238 of the initial height of the first conductive material 236 that was previously conformally deposited can be removed by selective masking and subsequently etching a portion of the first conductive material 236.

The remaining portion of the first conductive material 236 can overlay (e.g., be in physical contact with and cover) at least the surface 234-3 of the substrate and a portion of the second surface 234-2 of the first source drain region 232-1 and a portion of the first surface 234-4 of the second source/drain region 232-2. For instance, remaining portion of the first conductive material 236 can overlay and be in direct physical contact with at least the surface 234-3 of the substrate and a portion of the second surface 234-2 of the first source drain region 232-1 and a portion of the first surface 234-4 of the second source/drain region 232-2 as illustrated in FIG. 2B. At least the first surface 234-1 of the first source/drain region 232-2 and the second surface 235-5 of the second source/drain region 232-2 can be exposed subsequent to the etching of the portion 238 of the first conductive material 236. The remaining portion of the first conductive material 236 can extend to a given height 239 above a surface of the substrate 204. The thickness of the remaining portion (relative to an adjacent structure such as the substrate 204) can be equal to the thickness 237. Etching the portion 238 of the first conductive material 236 can form a deposition space for the second conductive material 242.

For instance, as illustrated in FIG. 2C the second conductive material 242 can be deposited in the deposition space for the second conductive material. The second conductive material 242 can be deposited on (e.g., overlaying and in direct physical contact with) the first conductive material 236. For instance, the second conductive material can be in direct physical contact (e.g., in the absence of intervening structures) with a top surface of the first conductive material 236 and a portion of the side surfaces of the source/drain regions horizontally adjacent to the second conductive material 242.

The second conductive material 242 can be deposited to final thickness 240 of the second conductive material 242 or can be deposited to a given thickness (e.g., that is larger than the final thickness 240) and can be subsequently etched to the final thickness 240 of the second conductive material 242. The final thickness 240 of the second conductive material 242 can be equal to the thicknesses described herein of the second conductive material 242. For instance, the final thickness 240 can be equal to the thickness 166 described in FIG. 1B.

The final thickness 240 can be a thickness that permits the second conductive material 242 to be recessed a distance 244 below a top surface of a source/drain region such as the first surface 234-1 of the first source/drain region 232-1. As illustrated in FIG. 2C, the second conductive material 242 can be deposited across an entire width of the trench when taken at any point along the height of the second conductive material.

As illustrated in FIG. 2D, a mask material 250 can be deposited in at least a remaining portion of the trench 235. For instance, the mask material 250 can be deposited at least on a top surface 251 of the second conductive material 242. As illustrated in FIG. 2D, the mask material 250 can be deposited on (e.g., overlay and be in direct physical contact with) the entire top surface 251 of the second conductive material 242. That is, in some embodiments, the mask material 250 can be deposited in the absence of a barrier material at an interface between the second conductive material 242 and the mask material 250. However, in some embodiments, a barrier material (not illustrated) such as a dielectric material (e.g., TiN) can be present at the interface between the second conductive material 242 and the mask material 250.

In some embodiments, the mask material 250 can be deposited at a final thickness of the mask material 250. However, in some embodiments the mask material 250 can be deposited at a given thickness and subsequently can be etched (e.g., dry etched) to a final thickness 275 of the mask material 250. For instance, as illustrated in FIG. 2D the mask material can be deposited at an initial thickness that is larger than the final thickness (e.g., thickness 167 as illustrated in FIG. 1B) of the mask material 250. The final thickness 275 can be equal to the thickness 167 described in FIG. 1B.

The mask material 250 can be etched from the initial thickness to a final thickness of the mask material, as illustrated in FIG. 2E. In some embodiments, a planarization (e.g., chemical mechanical planarization (CMP)) and/or a dry etch can be utilized to remove a portion of the mask material. For instance, in some embodiments the mask material 250 can be etched by a dry etching process. The final thickness of the mask material 250 can permit the mask material to be recessed a distance 254 below a top surface of a source/drain region such as the first surface 234-1 of the first source/drain region 232-1.

In some embodiments, a cap material (not shown) can be deposited on a top surface 253 of the mask material 250. Examples of the cap material include boron nitride (BN), silicon nitride ($SiN_X$, $Si_3N_4$), aluminum nitride (AlN), gallium nitride (GN), tantalum nitride (TaN, $Ta_2N$), titanium nitride (TiN, $Ti_2N$), and tungsten nitride (WN, $W_2N$, $WN_2$), for instance.

FIGS. 3A-3F illustrate views of a portion of an example semiconductor structure including a conductive structure at a particular stages in an example semiconductor structure fabrication sequence in accordance with a number of embodiments of the present disclosure.

As illustrated in FIG. 3A, source/drain regions such as a first source/drain region 332-1 and a second source/drain region 332-2 are present. As mentioned, the source/drain regions can be formed in and/or on a substrate 304.

As mentioned, a trench (e.g., trench 235 as illustrated in FIG. 2A) can be formed in the substrate 304. As mentioned, the trench can be formed by one or more semiconductor structure fabrication processes (e.g., etches, such as selective etches) to provide a conductive structure deposition space.

For example, as illustrated in FIG. 3A the first conductive material 336 can be deposited in the trench and, in some embodiments, can extend above the trench. For instance, as illustrated in FIG. 3A, the first conductive material 336 can be selectively deposited to a thickness 362 that is greater than a height of the trench. In such embodiments, the first conductive material 336 can be deposited on each of the source/drain regions (e.g., source/drain regions 332-1 and 332-2) and the substrate 304. For example, the first conductive material 336 can be initially deposited on at least at first (e.g., top) surface 334-1 and a second (e.g., side) surface 334-2 of the first source/drain region 332-1, a surface (e.g., top) surface 334-3 of the substrate 304, along with a first (e.g., side) surface 334-4 and a second (e.g., top) surface 334-5 of the second source/drain region 332-2, among other possibilities. For instance, a portion of the thickness 362 of the first conductive material 336 can extend a distance 365 above the first surface 334-1, among other possibilities. As illustrated in FIG. 3A, the first conductive material 336 can be deposited on a gate oxide 347, as described herein.

As illustrated in FIG. 3B, the deposited first conductive material 336 can undergo an etching process such as a wet etch and/or a dry etch to remove a portion of the deposited first conductive material. For instance, as illustrated in FIG. 3B, a portion of the first conductive material 336 that was previously deposited can be removed by selective masking and subsequently etching a portion of the first conductive material 336 to leave a remaining portion of the first conductive material having a given thickness 364. In some embodiments, the thickness 364 can be equal to or similar to (e.g., within 5 percent of) the height 239 illustrated in FIG. 2B. However, in some embodiments, the thickness 364 can be different (e.g., more than 5 percent greater than) the height 239. The thickness 364 can be equal to the thickness 165 as described in FIG. 1B.

The remaining portion of the first conductive material can overlay (e.g., be in physical contact with and cover) at least the surface 334-3 of the substrate 304 and a portion of the second surface 334-2 of the first source drain region 332-1 and a portion of the first surface 334-4 of the second source/drain region 332-2, as illustrated in FIG. 3B. Thus, at least the first surface 334-1 of the first source/drain region 332-2 and the second surface 335-5 of the second source/drain region 332-2 can be exposed subsequent to the etching of the first conductive material 336. Etching the portion of the first conductive material 336 can form a deposition space for the second conductive material 342.

The second conductive material 342 can be deposited in the deposition space for the second conductive material 342. For instance, as illustrated in FIG. 3C the second conductive material 342 can be deposited to an initial thickness on the first conductive material 336. The second conductive material 342 can be deposited on (e.g., overlaying and in direct physical contact with) the first conductive material 336. In such embodiments, the second conductive material 342 can be initially deposited on at least a first (e.g., top) surface 334-1 and a second (e.g., side) surface 334-2 of the first source/drain region 332-1, a surface (e.g., top) surface 334-3 of the substrate 304, along with a first (e.g., top) surface 334-4 and a second (e.g., side) surface 334-5 of the second source/drain region 332-2, among other possibilities. For instance, the second conductive material 342 can be deposited to a thickness that extends a distance 366 above the first surface 334-1, among other possibilities.

As illustrated in FIG. 3C, the second conductive material 342 can be deposited across an entire width of the trench extending between the source/drain regions. As illustrated in FIG. 3C, the second conductive material 342 can be deposited on (e.g., overlay and be in direct physical contact with) the entire top surface 341 of the first conductive material 336. Thus, whether conformally deposited, as described herein, or selectively deposited as described in FIG. 3C, the second conductive material 342 can overlay and be in direct physical contact with an entire top surface of the first conductive material 336.

As illustrated in FIG. 3D, the second conductive material 342 can be subsequently etched to a final thickness 340 of the second conductive material 342. The final thickness 340 of the second conductive material 342 can be equal to the thicknesses described herein of the second conductive material 342. However, in some embodiments, the second conductive material 342 can be initially deposited to the final thickness 340 of the second conductive material 342. The final thickness can be equal to the thickness 166 as illustrated in FIG. 1B.

As illustrated in FIG. 3E, a mask material 350 can be deposited in at least a remaining portion of the trench and on the second conductive material 342. For instance, the mask material 350 can be deposited at least on a top surface 351 of the second conductive material 342. As illustrated in FIG. 3E, the mask material 350 can be deposited on (e.g., overlay and be in direct physical contact with) the entire top surface 351 of the second conductive material 342. The mask material can be deposited at a thickness that extends a distance 370 above the first surface 334-1, among other possibilities. In some embodiments, a barrier material (not illustrated) can be present at an interface between the mask material 350 and the second conductive material 342. For instance, the barrier material such as a dielectric material can be deposited over an entire top surface of the second conductive material 336.

As illustrated in FIG. 3F, the mask material 350 can be etched and/or otherwise have a portion of the mask material 350 removed. For instance, the mask material 350 can be etched from the initial thickness in FIG. 3E to a final thickness 375 of the mask material 350, as illustrated in FIG. 3F. For instance, in some embodiments, a planarization (e.g., chemical mechanical planarization (CMP)) and/or a dry etch can be utilized to remove a portion of the mask material 350. The final thickness 375 of the mask material 350 can permit the mask material to be recessed distance 372 below a top surface of a source/drain region such as the first surface 334-1 of the first source/drain region 332-1. However, in some embodiments, the mask material 350 can be deposited at final thickness of the mask material 350. The final thickness 375 can be equal to the thickness 167 as described with respect to FIG. 1B.

As illustrated in FIG. 3F, in some embodiments, a conductive structure can be formed of the first conductive material 336, the second conductive material 342 and can have a mask material 350 such as a polysilicon material deposited on the conductive structure. In some embodiments, a cap material (not shown) can be deposited on a top surface 353 of the mask material 350 and/or on a portion of the source/drain regions such as on the top surface 334-1. Examples of the cap material include boron nitride (BN), silicon nitride ($SiN_X$, $Si_3N_4$), aluminum nitride (AlN), gallium nitride (GN), tantalum nitride (TaN, $Ta_2N$), titanium nitride (TiN, $Ti_2N$), and tungsten nitride (WN, $W_2N$, $WN_2$), for instance.

While not shown in FIGS. 2A-2E and 3A-3F, embodiments provide that a number of further semiconductor structure fabrication process steps can be performed. For instance, a photolithographic technique may be used to pattern a photolithographic mask on a material prior to etching one or materials. One or more embodiments provide that a material such as a dielectric material can be removed (e.g., with selective etching) in preparation for a photolithographic technique that may be used to pattern a photolithographic mask on the semiconductor structure prior to etching one or materials, which may be followed by a fill process (e.g., spin on dielectric).

Figure 4:
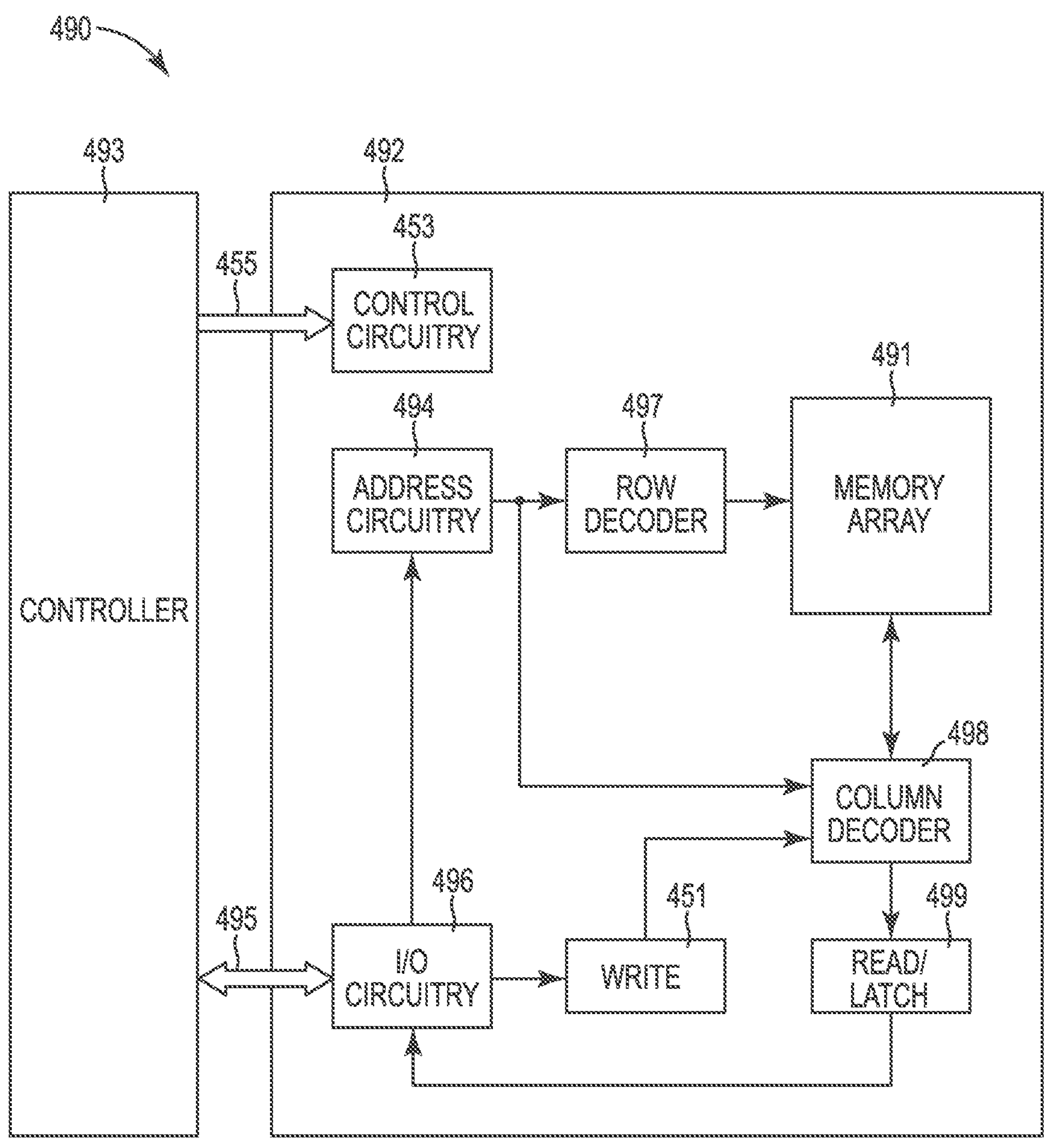
FIG. 4 is a block diagram illustration of an example apparatus, such as an electronic memory system, in accordance with an embodiment of the present disclosure.

FIG. 4 is a block diagram illustration of an example apparatus, such as an electronic memory system 490, in accordance with an embodiment of the present disclosure. Memory system 490 may include an apparatus, such as a memory device 492 and a controller 493, such as a memory controller (e.g., a host controller). Controller 493 might include a processor, for example. Controller 493 might be coupled to a host, for example, and may receive command signals (or commands), address signals (or addresses), and data signals (or data) from the host and may output data to the host. Controller 493 can perform one or more operations for storing one data value by programming a first memory cell and a second memory cell, in accordance with the present disclosure.

Memory device 492 includes a memory array 491 of memory cells. For example, memory array 491 may include one or more of the memory arrays, such as a vertical pillar array, of memory cells discussed herein. Memory device 492 may include address circuitry 494 to latch address signals provided over I/O connections 495 through I/O circuitry 496. Address signals may be received and decoded by a row decoder 497 and a column decoder 498 to access the memory array 491.

Memory device 492 may sense (e.g., read) data in memory array 491 by sensing voltage and/or current changes in the memory array columns using sense/buffer circuitry that in some examples may be read/latch circuitry 499. Read/latch circuitry 499 may read and latch data from the memory array 491. Sensing circuitry (not shown) may include a number of sense amplifiers coupled, for instance via conductive structures such as the access lines described herein to memory cells of memory array 491, which may operate in combination with the read/latch circuitry 499 to sense (e.g., read) memory states from targeted memory cells. I/O circuitry 496 may be included for bi-directional data communication over the I/O connections 495 with controller 493. Write circuitry 451 may be included to write data to memory array 491.

Control circuitry 453 may decode signals provided by control connections 455 from controller 493. These signals may include chip signals, write enable signals, and address latch signals that are used to control the operations on memory array 491, including data read and data write operations.

Control circuitry 453 may be included in controller 493, for example. Controller 493 may include other circuitry, firmware, software, or the like, whether alone or in combination. Controller 493 may be an external controller (e.g., in a separate die from the memory array 491, whether wholly or in part) or an internal controller (e.g., included in a same die as the memory array 491). For example, an internal controller might be a state machine or a memory sequencer.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

While example examples including various combinations and configurations of semiconductor materials, underlying materials, structural materials, dielectric materials, capacitor materials, working surface materials, silicate materials, nitride materials, buffer materials, etch chemistries, etch processes, solvents, memory devices, memory cells, sidewalls of openings and/or trenches, among other materials and/or components related to stacking a semiconductor structure have been illustrated and described herein, examples of the present disclosure are not limited to those combinations explicitly recited herein. Other combinations and configurations of the semiconductor materials, underlying materials, structural materials, dielectric materials, capacitor materials, substrate materials, working surfaces, silicate materials, nitride materials, buffer materials, etch chemistries, etch processes, solvents, memory devices, memory cells, sidewalls of openings and/or trenches related to stacking a semiconductor structure than those disclosed herein are expressly included within the scope of this disclosure.

What is claimed is:

1. An apparatus comprising:

a first conductive material including a conductive metal nitride formed in a trench formed by a first source/drain region and a second source/drain region, wherein:
  the first conductive material has a thickness of at least 0.5 nanometers; and
  the first conductive material is formed on a side surface of the first source/drain region and a side surface of the second source/drain region;

a second conductive material including a conductive metal formed in the trench formed by the first source/drain region and the second source/drain region, wherein the second conductive material is disposed on a first surface of the first conductive material; and a mask material formed on a top surface of the second conductive material, wherein a top surface of the mask material is formed to a height that is less than a height of a top surface of the first source/drain region and a height of a top surface of the second source/drain region.

2. The apparatus of claim 1, wherein a width of the first conductive material at an interface between the first conductive material and the second conductive material is equal to the width of the second conductive material at the interface.

3. The apparatus of claim 2, wherein the conductive metal nitride further comprises titanium nitride (TiN), tantalum nitride (TaN), or a combination thereof.

4. The apparatus of claim 2, wherein the conductive metal nitride is TiN.

5. The apparatus of claim 1, wherein the conductive metal further comprises tungsten (W), titanium (Ti), tantalum (Ta), ruthenium (Ru), cobalt (Co), molybdenum (Mo), or any combination thereof.

6. The apparatus of claim 1, wherein the conductive metal is Mo.

7. The apparatus of claim 1, wherein the apparatus includes an access line comprising the first conductive material and the second conductive material.

8. An apparatus comprising:

a first source/drain region and a second source/drain region;

a first conductive material including a conductive metal nitride formed in a trench formed by the first source/drain region and the second source/drain region, wherein:

the first conductive material has a thickness of at least 0.5 nanometers extending in a vertical direction; and the first conductive material is formed on a side surface of the first source/drain region and a side surface of the second source/drain region;

a second conductive material including a conductive metal formed in the trench formed by the first source/drain region and the second source/drain region, wherein the second conductive material is disposed on a top surface of the first conductive material; and a mask material formed on the top surface of the second conductive material, wherein a top surface of the mask material is formed to a height that is less than a height of a top surface of the first source/drain region and a height of a top surface of the second source/drain region.

9. The apparatus of claim 8, wherein the thickness of the first conductive material is in a range from 0.5 nanometers to 90 nanometers, and wherein the thickness of the second conductive material is in a range from 10 nanometers to 100 nanometers.

10. The apparatus of claim 8, wherein a sum of the thickness of the first conductive material and the thickness of the second conductive material is at least 80 nanometers.

11. The apparatus of claim 8, wherein a sum of the thickness of the first conductive material and the thickness of the second conductive material is equal a total thickness of an access line.

12. The apparatus of claim 8, wherein the second conductive material is disposed only on the top surface of the first conductive material.

13. The apparatus of claim 8, wherein the second conductive material is disposed on a plurality of surfaces of the first conductive material.

14. An apparatus comprising:

a semiconductor substrate;

a first source/drain region and a second source/drain region formed in or on the semiconductor substrate; and a conductive structure located between at least a portion of the first source/drain region and the second source/drain region, the conductive structure including:

a first conductive material including a conductive metal nitride formed in a trench formed by the first source/drain region and the second source/drain region, wherein the first conductive material has a thickness of in a range from 0.5 nanometers to 90 nanometers extending in a vertical direction, wherein the first conductive material is titanium nitride (TiN); and a second conductive material including a conductive metal formed in the trench formed by the first source/drain region and the second source/drain region, wherein the second conductive material is disposed on a top surface of the first conductive material and has a thickness in a range from 10 to 100 nanometers, wherein a sum of the thickness of the first conductive material and the thickness of the second conductive material is in a range from 60 to 100 nanometers, wherein the second conductive material is molybdenum (Mo); and a mask material formed on the top surface of the second conductive material, wherein a top surface of the mask material is formed to a height that is less than a height of a top surface of the first source/drain region and a height of a top surface of the second source/drain region.

15. The apparatus of claim 14, wherein the thickness of the first conductive material is greater than the thickness of the second conductive material.

16. The apparatus of claim 14, wherein the thickness of the first conductive material is at least two times greater than the thickness of the second conductive material.

17. The apparatus of claim 14, wherein a first width of the first conductive material is equal to a second width of the second conductive material at an interface between the first conductive material and the second conductive material.

18. The apparatus of claim 14, wherein the apparatus is part of a dynamic random access memory (DRAM) array, and wherein the conductive structure is an access line in the DRAM array.

19. The apparatus of claim 14, wherein a barrier material is disposed at an interface between the mask material and a top surface of the second conductive material.

* * * * *